(12) United States Patent
Li et al.

(10) Patent No.: US 6,499,214 B2
(45) Date of Patent: Dec. 31, 2002

(54) METHOD OF MAKING A CIRCUIT BOARD

(75) Inventors: Delin Li, San Jose, CA (US); Richard Keith McMillan, Dearborn, MI (US); Zhong-You Shi, Ann Arbor, MI (US)

(73) Assignee: Visteon Global Tech, Inc., Dearborn, MI (US)

( * ) Notice: Subject to any disclaimer, the term of this patent is extended or adjusted under 35 U.S.C. 154(b) by 0 days.

(21) Appl. No.: 09/812,449

(22) Filed: Mar. 20, 2001

(65) Prior Publication Data

US 2002/0136873 A1 Sep. 26, 2002

Related U.S. Application Data

(60) Provisional application No. 60/207,647, filed on May 26, 2000.

(51) Int. Cl.[7] .................................................. H05K 3/20
(52) U.S. Cl. .............................. 29/831; 29/830; 29/846; 29/852
(58) Field of Search ........................ 29/825, 830, 831, 29/846, 852

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 5,282,312 A | * | 2/1994 | DiStefano et al. |
| 5,628,852 A | * | 5/1997 | Ishida .......................... 29/830 |
| 5,640,761 A | * | 6/1997 | DiStefano et al. ............. 29/830 |
| 5,738,797 A | | 4/1998 | Belke, Jr. et al. |
| 6,081,988 A | * | 7/2000 | Pluymers et al. ............. 29/830 |
| 6,119,338 A | * | 9/2000 | Wang et al. ................... 29/830 |
| 6,266,874 B1 | * | 7/2001 | DiStefano et al. ............. 29/830 |

* cited by examiner

Primary Examiner—Carl J. Arbes
(74) Attorney, Agent, or Firm—Visteon Global Tech. Inc.

(57) ABSTRACT

A method 10, 110 for making multi-layer circuit boards having metallized apertures 38, 40, 130, 132 which may be selectively and electrically grounded and having at least one formed air-bridge 92, 178.

13 Claims, 13 Drawing Sheets

METHOD OF MAKING A CIRCUIT BOARD

This application claims benefit of Provisional Application Ser. No. 60/207,647 filed May 26, 2000.

FIELD OF THE INVENTION

The present invention relates to a circuit board and a method for making an electronic circuit board and, more particularly, to a method for making a multi-layer electronic circuit board having metallized apertures which may be selectively connected and/or detached or isolated from an electrical ground plane and/or from a source of an electrical ground potential.

BACKGROUND OF THE INVENTION

Multi-layer circuit boards contain and/or include electrical components which selectively and operatively populate opposed top and bottom surfaces of each board (or other respective interior portions of each of the boards), thereby desirably allowing each of the electronic circuit boards to contain and/or include a relatively large amount of electrical components which efficiently and densely populate the respective boards.

It is desirable to allow for communication by and between and/or interconnection of the component containing surfaces and/or portions of an electronic circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires that one or more holes be drilled through each of the circuit boards, thereby creating at least one "through hole" or "via" lying and/or traversing between some or all of the opposed component containing surf aces and through some or all of the various component containing interior circuit board portions. Such drilling is undesirable since it is relatively time consuming, costly, potentially causes damage to significant numbers of the formed electronic circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow for communication of electrical power signals by and between the board surfaces and/or by and between the board surfaces and the interior component containing portions.

There is therefore a need to provide a method for producing a multi-layer electronic circuit board which overcomes some or all of the previously delineated drawbacks and which selectively allows grounded and nonground "vias" to be desirably and selectively formed.

SUMMARY OF THE INVENTION

It is a first object of the present invention to provide a method for producing a multi-layer electronic circuit board which overcomes some or all of the previously delineated drawbacks of prior multi-layer electronic circuit board forming methodologies and techniques.

It is a second object of the invention to provide a method for producing a multi-layer electronic circuit board which overcomes some or all of the previously delineated drawbacks of prior multi-layer electronic circuit board forming methodologies and techniques and which allows for the selective, efficient, and reliable formation of metallized apertures which cooperatively allow for communication by and between some or all of the various component containing surfaces and/or portions of the formed multi-layer electronic circuit board, which cooperatively allow for the selective interconnection of these components, and which are further adapted to selectively and communicatively receive an electrical component.

It is a third object of the invention to provide a method for producing a multi-layer circuit board which overcomes some or all of the previously delineated drawbacks of prior multi-layer circuit board forming methodologies and techniques and which allows for the selective formation of metallized apertures which may be selectively connected or disconnected and/or isolated from a selectively formed electrical ground plane or bus.

According to a first aspect of the present invention, a multi-layer circuit board is provided. The multi-layer circuit board comprises a first electrically conductive member having a first surface, a second surface, and further having a stepped aperture extending through the first and second surfaces; a first dielectric material which is coupled to the first surface; a second dielectric material which is coupled to the second surface; a first circuit assembly having a second electrically conductive member which is coupled to the first dielectric material, the first circuit assembly further including a third electrically conductive member and a first core member which is contained between the second and the third electrically conductive members and which includes at least one air-bridge; and a second circuit assembly having a fourth electrically conductive member which is coupled to the second dielectric material, the second circuit assembly further including a fifth electrically conductive member and a second core member which is contained between a fourth and a fifth electrically conductive members and which includes at least one air-bridge, the second circuit assembly cooperating with the first circuit assembly and with the first and second dielectric material and with the first electrically conductive member to form a multi-layer electronic circuit board.

According to a second aspect of the present invention a circuit assembly is provided. The circuit assembly is made by the process of providing a core member; etching the provided core member effective to selectively form at least one aperture within the core member, the at least one aperture having a ridged surface; providing at least one pre-circuit assembly having a second member; attaching the at least one pre-circuit assembly to the core member; and selectively etching the second member effective to extend the at least one aperture through the second member, thereby forming a circuit board assembly.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
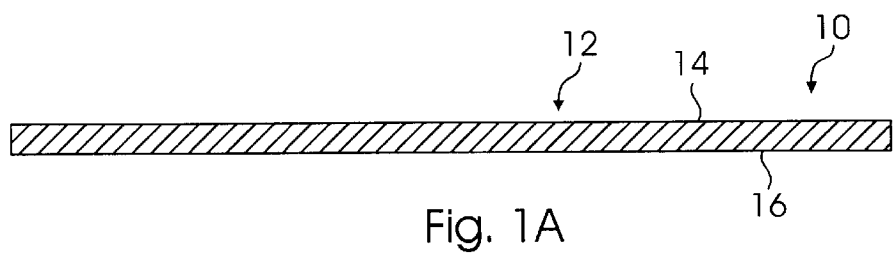
FIGS. 1(a)–(g) are successive sectional side views of a multi-layer circuit board being produced and/or formed in accordance with the teachings of the preferred embodiment of the invention.

Referring now to FIGS. 1(a)–(g), there is shown a method and/or a process 10 for selectively forming a multi-layer electronic circuit board in accordance with the teachings of a first and preferred embodiment of the invention. Specifically, as shown best in FIG. 1(a), the circuit board formation and/or creation process 10 begins with the acquisition and/or creation of an electrically conductive member or core member 12, such as and without limitation a "metal foil" member, having a top or first surface 14 and a bottom or second surface 16 (the terms "first" and "second" may alternately and respectively refer to the bottom surface 16 and the top surface 14). In one non-limiting embodiment of the invention, member 12 is generally rectangular in shape, however other shapes may be utilized. Further, in one non-limiting embodiment, metal foil 12 may selectively comprise a copper strip or foil.

The second step of process 10, as shown best in FIG. (b), requires that a certain commercially available dielectric etch resistant/adhesive material 18, 20 be respectively and selectively placed upon certain portions of the top or first surface 14 and the bottom or second surface 16 of metal foil member 12 by a conventional printing process or imaging process, thereby creating exposed top surface portions 22, 24 and exposed bottom surface portions 26, 28 and forming a "pre-circuit" assembly 36. It should be appreciated that various shapes, sizes, and numbers of portions 22, 24 may be selectively created and/or utilized to achieve various types of circuit board configurations. The foregoing description exemplifies only one type of selected pattern and/or configuration and should not limit the generality of the invention.

In the preferred embodiment of the invention, some of the exposed portions (such as and without limitation portions 24, 28) are substantially aligned. That is, portion 28 substantially and wholly resides under and is substantially identical in size and shape to portion 24. Other of the exposed portions (such as and without limitation portions 22 and 26) are "offset", "dislocated", and/or "misaligned". Particularly, as shown, portion 26 does not wholly reside under portion 22, although portions 26 and 22 may be substantially identical in size and shape.

Figure 1B:
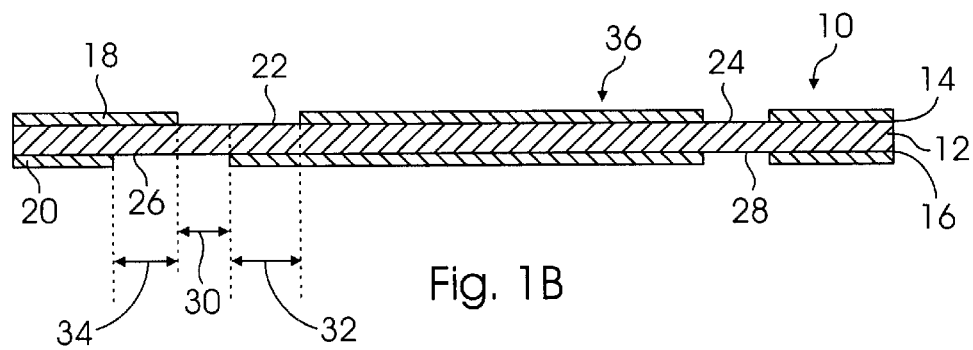

This "misalignment" is shown best in FIG. 1(b) and may be further described by use of the illustrated regions or areas 30-34. That is, region or area 30 comprises and/or represents an exposed region or area of portion 22 which wholly resides over an exposed area or region of portion 26. Region or area 32 represents or comprises an exposed region or area of portion 22 which is offset from (i.e., does not reside above) an exposed region or area of portion 26. That is, surface 14 of member 12 is exposed in this region 32 while surface 16 of member 12 is not exposed in this region, but rather is covered by etch resistant material 20. Region or area 34 represents an exposed area or region of portion 26 which is offset from (i.e., does not reside below) an exposed area or region of portion 22. Surface 16 of member 12 is exposed in this region 34 while surface 14 of member 12 is not exposed in this region, but rather is selectively covered by the dielectric etch resistant material 18. Portions 22, 24 and portions 26, 28, as will be further delineated below, cooperatively and selectively allow for the creation of "stepped" or "ridged" "vias" or "perforations" within the metal core member 12 without the need for undesired drilling. Particularly, substantially aligned portions 24, 28 cooperatively form a "non-grounded via" or "through hole" while "misaligned" or "offset" portions 22, 26 cooperatively form an electrically grounded "via" or "through hole".

Figure 1C:
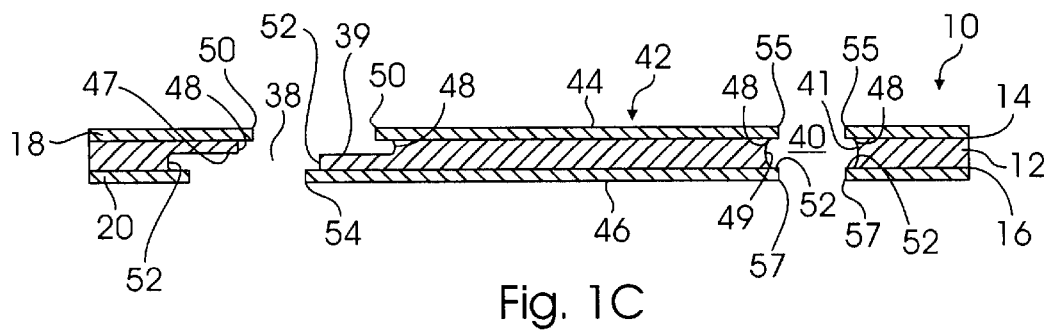

In the third step of process 10, as shown best in FIG. 1(c), the pre-circuit assembly 36 is selectively immersed in a conventional and commercially available etchant material (i.e., a copper etchant), effective to respectively create apertures and/or perforations 38, 40 through the exposed portion pairs 22, 26 and 24, 28, and through the metal foil or core member 12, thereby creating pre-circuit assembly 42 having a first or top surface 44 and a second or bottom surface 46. Alternately, the term "first" and "second" may respectively refer to the bottom surface 46 and the top surface 44.

The selectively created apertures 38, 40 are therefore "metallized". That is, apertures 38, 40 are formed within metal core member 12 and therefore are bounded and/or defined by the metal core member 12 (e.g., certain portions 47, 49 of the member 12 respectively reside within and "bound" the apertures 38, 40).

More particularly, the etchant removes the portion of member 12 which resides within the region or area 30. Further, due to the misalignment of portions 22, 26, the etchant also removes about one-half of the bottom portion of the core 12 which resides within region or area 34 (i.e., the bottom portion of core 12 which integrally terminates upon surface 16), and about one-half of the top portion of the core 12 which resides within region or area 32 (i.e., the portion of the core 12 which integrally terminates upon surface 14). The etchant is also made to selectively "etch away" or remove certain portions 52 of the surface 47, 49 of the member 12 which reside over material 20 and certain portions 48 of the surfaces 47, 49 of the member 12 which reside under material 18, thereby causing respective portions 50, 54 of the dielectric material 18 and 20 to extend over and/or partially overlay or overhang the formed apertures 38, 40. As shown, the selectively created aperture 38 is "stepped" and/or has a "ridged" interior surface 47 (i.e., has at least one step or ridge 39), thereby allowing electrically conductive material and/or components (which are selectively placed within the aperture 38) to be firmly positioned in the aperture 38.

By selectively allowing the etchant to reside within and/or traverse the aperture 40, surface 49 may be "bowed" or curved, thereby allowing electrically conductive material or a component/conductor to be firmly placed within aperture 40. The circuit assembly 42, as shown in FIG. 1(c), may be utilized as a circuit board and may be selectively populated by electrical components. Alternatively, the created circuit assembly 42 may be utilized as a "pre-circuit" or "pre-circuit board" assembly and be further processed in accordance with the various other process steps illustrated in the following diagrams and included, by way of example and without limitation, within process 10. Hence, while the following description refers to the assembly 42 as a "pre-circuit" assembly, it should be realized that assembly 42 may be used as and/or comprise a completed and operable circuit assembly which may operatively and selectively receive electronic components.

Figure 10A:
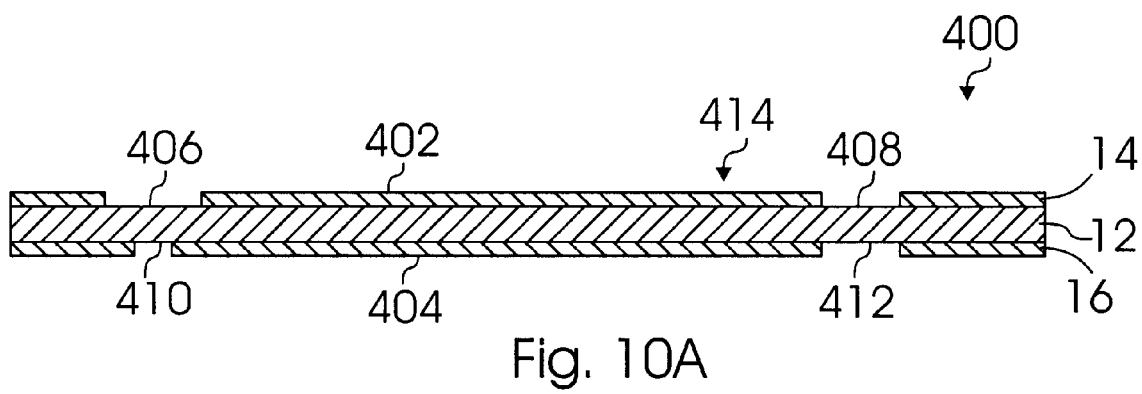
FIGS. 10(a)–(b) are successive sectional side views of a multi-layer circuit board being produced and/or formed in accordance with the teachings of a tenth embodiment of the invention.
Figure 10B:
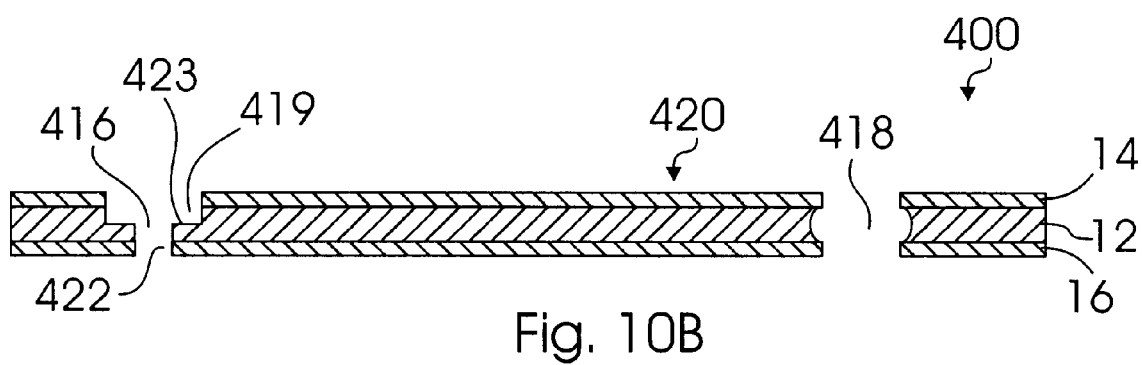

It should be appreciated that in a further non-limiting embodiment of the invention, the second and third process steps of process 10, as shown best in FIGS. 1(b) and (c), may be replaced by the first and second process steps of circuit board formation process or method 400 which is shown best in FIGS. 10(a) and 10(b). The first step of process 400, shown best in FIG. 10(a), requires that a commercially available dielectric material 402, 404 be respectively and selectively placed upon certain portions of the top or first surface 14 and the bottom or second surface 16 of metal foil member 12 by a conventional printing process, thereby creating exposed top surface portions 406, 408 and exposed bottom portions 410, 412 and forming a "pre-circuit" assembly 414 which may be used as a replacement for "pre-circuit" assembly 36. In this non-limiting embodiment, portions 408 and 412 are substantially aligned (i.e., portion 412 wholly resides under portion 408 and is of substantially the same size and shape as portion 408). Further, portion 410 is substantially smaller than portion 406 and wholly resides under portion 406.

In the second step of process 400, which is best shown in FIG. 10(b), the pre-circuit assembly 414 is selectively immersed in a conventional and commercially available etchant material, effective to respectively create apertures and/or perforations 416, 418 through the pairs 406, 410; and 408, 412, and through the metal foil or core member 12, thereby respectively creating apertures 416, 418 and forming a pre-circuit assembly 420 which may be used as a replacement for pre-circuit assembly 42 and which may be further processed in accordance with the remaining process steps of process 10 which are more fully delineated below. Particularly, aperture 418 is substantially identical to aperture 40 while aperture 416 has a wide portion 419 and a narrow portion 422 which communicate through step or ridged portion 423. The subsequently delineated process steps of process 10 therefore are equally and selectively applicable to the pre-circuit assembly 420.

Figure 1D:
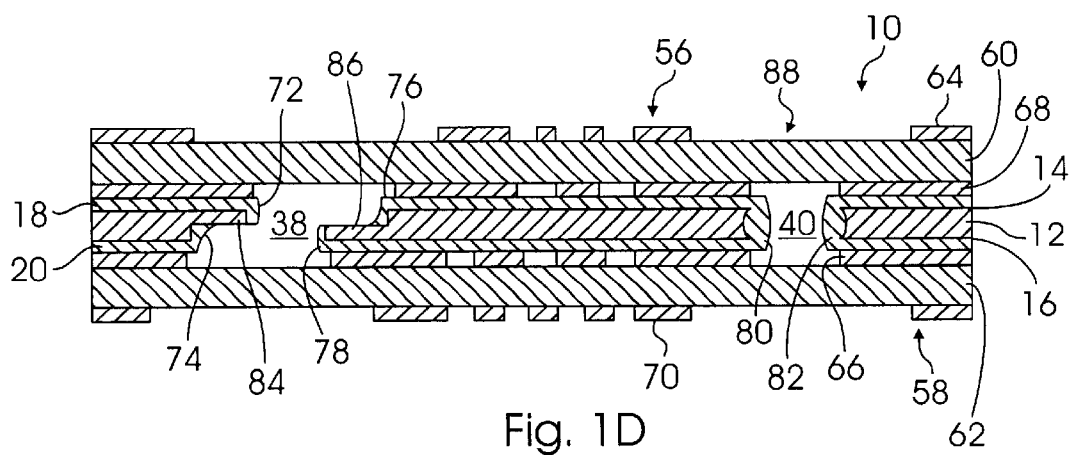

In the fourth step of process 10, as shown best in FIG. 1(d), pre-circuit assembly 42 is selectively "grown" as additional "layers" of materials or members are selectively added to the previously created electronic circuit board assembly or "pre-circuit" assembly 42, thereby forming a pre-circuit assembly 88. As shown, pre-formed and/or pre-circuit assemblies 56, 58 are selectively attached to the pre-circuit assembly 42 which was created in the third step of process 10 and which is best shown in FIG. 1(c).

As shown, each pre-circuit assembly 56, 58 respectively includes a central core portion or member 60, 62. Each member 60, 62, in one non-limiting embodiment of the invention, is dissimilar from metal portion 20. Moreover, in one non-limiting embodiment, portions 60, 62 are each substantially identical and each comprise conventional and commercially available aluminum material. Each pre-circuit assembly 56, 58 further respectively includes several top portions or members 64, 66 and several bottom portions or members 68, 70. In one non-limiting embodiment of the invention, members or portions 64-70 each comprise a conventional and commercially available copper material. Hence, portions 64, 66, 68, and 70 may each be substantially similar to core member 12. Members 68 and 66 are respectively attached to unique portions or regions of dielectric material 18, 20 of pre-circuit assembly 42. In this manner, portions 60, 62 of pre-circuit assemblies 56, 58 cooperatively overlay the previously formed apertures 38, 40, thereby forming pre-circuit assembly 88.

In one non-limiting embodiment of the invention, pre-circuit assembly 56 and pre-circuit assembly 58 are attached to pre-circuit assembly 42 by respectively laminating members 68, 66 to dielectric material portions 18, 20. In a further non-limiting embodiment of the present invention, the process of lamination, as set forth above, requires subjecting pre-circuit assemblies 42, 56, 58 to a relatively high temperature and to a relatively high pressure, thereby causing the respective "overhanging" dielectric material 18, 20 to "flow", "move", and/or to be moveably placed within each of the respective apertures 38, 40, effective to substantially and attachably cover interior surfaces 47, 49 of each aperture 38, 40 while allowing portions 84, 86 of the surface 47 to remain substantially "uncovered". It should be understood that the dielectric material 18, 20 which is moveably placed within aperture 40 selectively and substantially isolates and/or insulates surface 49 from physical and electrical contact with a component and/or element and/or member which may be selectively placed within the aperture 40.

Figure 1E:
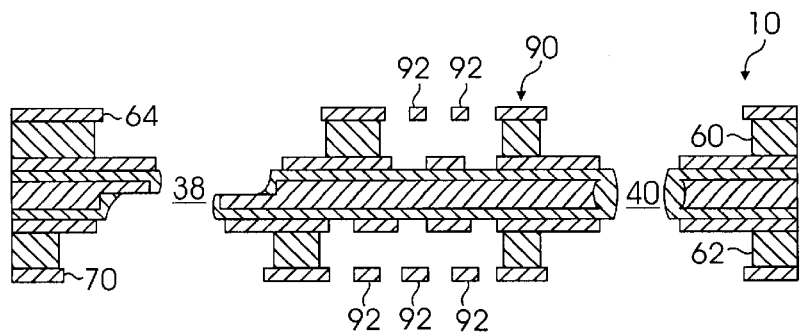

In the fifth step of the process 10, which is best shown in FIG. 1(e), pre-circuit assembly 88 is selectively immersed in a conventional and commercially available etchant material (e.g., an aluminum etchant material) which removes portions of the core members 60, 62 of each of the respective pre-circuit assemblies 56, 58 which overlay apertures 38, 40 while concomitantly creating a pre-circuit assembly 90 having selectively formed air-bridges 92. In this manner, apertures 38, 40 extendably traverse the formed assembly 90 and, more particularly, through core members 60, 62 of respective pre-circuit assemblies 56, 58. In this manner, additional and component containing layers are added to the previously formed pre-circuit assembly 42 and the apertures 38, 40 are made to extendably traverse the formed circuit assembly 90, thereby allowing for selective interconnection by and between components contained upon and/or within the formed circuit board.

Figure 1F:
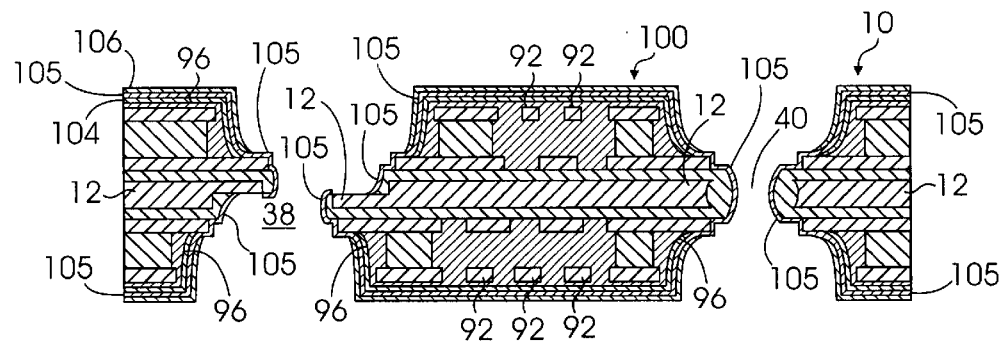

In the sixth step of process 10, which is shown best in FIG. 1(f), a conventional and commercially available "solder mask" material 96 is applied to the formed pre-circuit assembly 90 and substantially covers the exposed portions of pre-circuit assemblies 56, 58 including portions or members 64, 66, 68, and 70, while concomitantly "underfilling" and/or structurally supporting the formed air-bridges 92. In the preferred embodiment of the invention, material 96 is not placed upon the portion of materials 18, 20 or member 12 which are respectively resident within apertures 38, 40.

In one non-limiting embodiment of the invention, this solder mask material 96 is applied to pre-circuit assembly 90 by a conventional "screen printing" process. After the solder mask material 96 is applied to the pre-circuit assembly 90, a first layer of conventional "plating resistant" material 104 is applied upon the solder mask material 96. A conventional and commercially available "conditioner" is then applied to the dielectric material 18, 20 which was respectively placed within the apertures 38, 40. In one non-limiting embodiment of the invention, it should be understood that the conditioner creates "micro-holes" and/or "micro-apertures" on the surface of portions 72, 74, 76, 78, 80, and 82, effective to allow for relatively better adhesion of a subsequently applied layer of material 105. Particularly, a "seed layer" of an electrically conductive material 105 is applied to pre-circuit assembly 100, substantially covering and/or overlaying material 104 and portions 72, 74, 76, 78, 70, and 82. In one non-limiting embodiment of the invention, the electrically conductive material 105 which is applied as the "seed layer" comprises a conventional and commercially available copper material. It should be understood that the "seed layer" of electrically conductive material 105 allows for relatively efficient electroplating of the formed apertures 38, 40. A second layer of plating resistant material 106 is then selectively applied upon portions of the electrically conductive material 105.

Figure 1G:
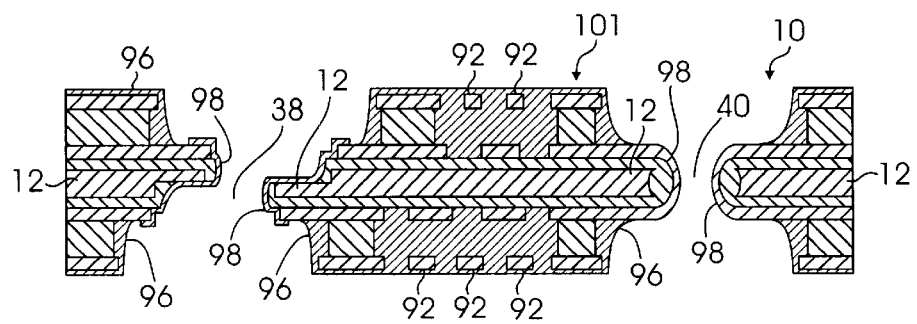

The seventh step of process 10, a shown best in FIG. 1(g), requires that an electrically conductive material 98 be applied to the interior surfaces 47, 49 of the apertures 38, 40. In one non-limiting embodiment of the invention, the electrically conductive material 98 comprises a conventional and commercially available copper material. In a further non-limiting embodiment of the invention, the electrically conductive material 98 is applied to surfaces 47, 49 of apertures 38, 40 by a conventional electroplating process.

Once the apertures 38, 40 have been electroplated, the second layer of plating resistant material 106 is "stripped" or otherwise removed. Electrically conductive material 105 which resides upon material 104 is then selectively removed by selectively exposing the electrically conductive material 105 to a conventional etchant material (e.g., a copper etchant). The first layer of plating resistant material 104 is then "stripped" and/or otherwise removed from solder mask material 96, in a known and conventional manner, thereby exposing the solder mask 96 as shown in FIG. 1(g) and forming the pre-circuit assembly or circuit board 101 having at least one grounded metal aperture or "via" 38(e.g., member 12, which may selectively be coupled to a source of electrical ground potential and which thereby selectively forms an electrical ground plane, is exposed within aperture 38), and an non-grounded aperture or "via" 40 (e.g., member 12 is not exposed within aperture 40) which are formed by a process which obviates the need for drilling. In a further non-limiting embodiment of the invention, a conventional and commercially available surface finish material may be applied to the solder mask material 96.

Figure 2:
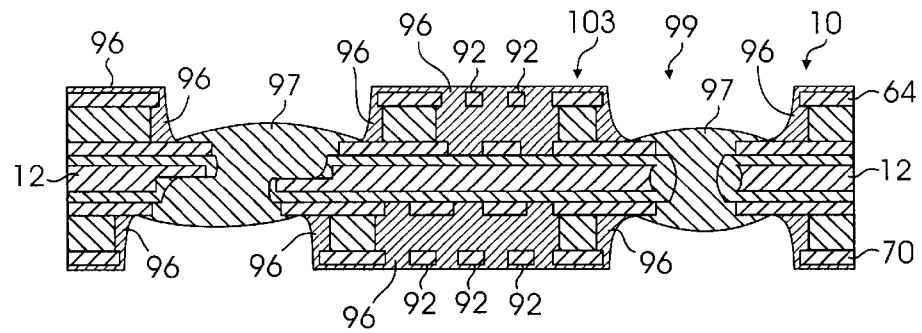
FIG. 2 is a sectional side view of a multi-layer circuit board being produced and/or formed in accordance with the teachings of a second embodiment of the invention.

Referring now to FIG. 2, there is shown an alternate embodiment of the invention. Particularly, FIG. 2 illustrates another alternative process 99 by which pre-circuit assembly 90 may be further processed, thereby obviating the need for electroplating. In this non-limiting embodiment of the invention, the "solder mask" material 96 is selectively applied to pre-circuit assembly 90. In one non-limiting embodiment, a conventional surface finish material is then selectively applied upon the "solder mask" material 96 and an electrically conductive material 97 is selectively placed within apertures 38, 40, thereby forming pre-circuit assembly 103. In one non-limiting embodiment of the invention, electrically conductive material 97 comprises a conventional and commercially available solder material. In a further non-limiting embodiment of the invention, electrically conductive material 97 comprises a conventional electrically conductive adhesive material.

Referring now to FIGS. 3(a)–(g), there is shown a method and/or process 110 for selectively forming a multi-layer electronic circuit board in accordance with the teachings of an alternate embodiment of the invention. Specifically, as shown best in FIG. 3(a), the circuit board formation or process 110 begins with the acquisition of a metal foil member or core member 112 having a top surface 114 and a bottom surface 116. In one non-limiting embodiment of the invention, member 112 is electrically conductive and generally rectangular in shape. In this non-limiting embodiment, metal foil 112 comprises a copper strip or foil.

Figure 3A:
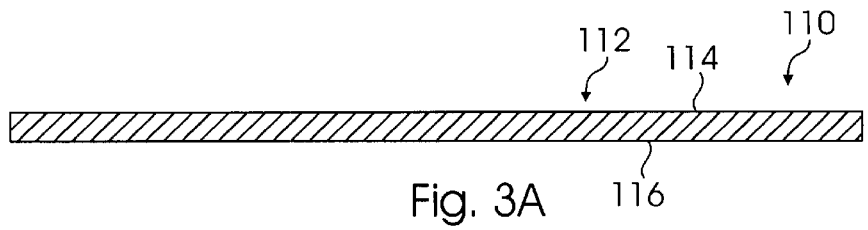
FIGS. 3(a)–(h) are successive sectional side views of a multi-layer circuit board being produced and/or formed in accordance with the teachings of a third embodiment of the invention.
Figure 3B:
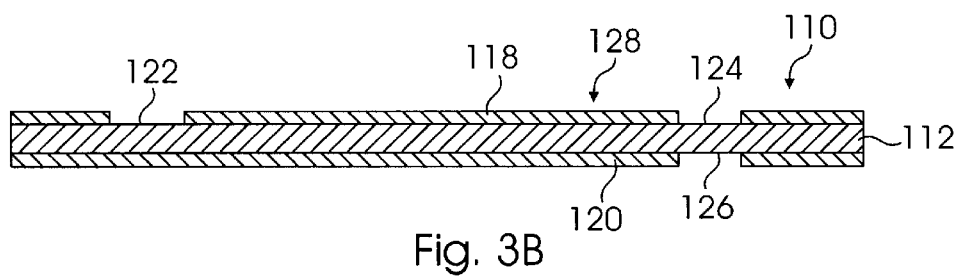

The second step of process 110, as shown best in FIG. 3(b), requires that a certain commercially available dielectric etch resistant material 118, 120 be respectively placed upon certain portions of the top surface 114 and the bottom surface 116 of metal foil member 112 by a conventional printing process, thereby creating exposed top surface portions 122, 124 and exposed bottom surface portion 126 and forming pre-circuit assembly 128. In the preferred embodiment of the invention, exposed portions 124 and 126 are substantially aligned (e.g., portion 126 wholly resides under portion 124 and is substantially the same size and shape as portion 124) and portions 122 and 124 reside upon surface 114 while portion 126 resides upon surface 116. As will be further delineated below, portions 124, 126 cooperatively and selectively allow for the creation of a "via" or "perforation" within the metal core member 112 while portion 122 forms an aperture which terminates within member 112.

Figure 3C:
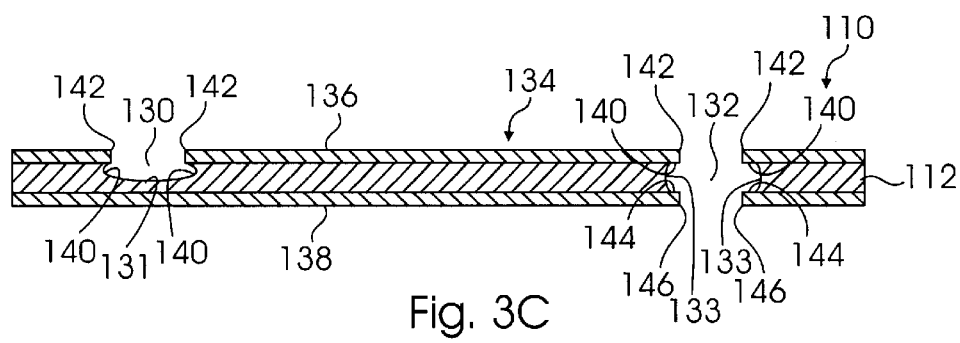

In the third step of process 110, as shown best in FIG. 3(c), the pre-circuit assembly 128 is selectively immersed in a conventional and commercially available etchant material, effective to create apertures and/or perforations 130, 132 within core metal portion 112, thereby forming pre-circuit assembly 134 having a top surface 136 and a bottom surface 138. The selectively created apertures 130, 132 are therefore "metallized".

That is, apertures 130, 132 are formed within metal core member 112 and therefore are bounded or defined by the metal core member 112. It should be understood that the aperture 132 is formed by selectively applying etchant to each exposed surface portion 124, 126, and extends through the pre-circuit assembly 134. Moreover, aperture 130 is formed by selectively applying etchant to the exposed surface portion 122, and terminates within member 112 while having a depth which, in one non-limiting embodiment, is equal to about one half of the thickness of the member 112.

As shown best in FIG. 3(c), as a result of such etching, certain selective portions 140 of metal core member 112 are selectively removed from beneath certain selective portions 142 of the dielectric material 118 residing upon top surface 114 of metal core member 112 and certain selective portions 144 of metal core member 112 are removed from above certain portions 146 of the dielectric material 120 residing upon bottom surface 116 of metal core member 112, thereby causing certain portions 142, 146 of dielectric material to "overhang" metal core member 112 and/or extend over apertures 130, 132. Apertures 130, 132 respectively have curved or concave interior surfaces 131, 133. The pre-circuit assembly 134, as shown best in FIG. 3(c), may be utilized as a circuit board and may be selectively populated by electrical components. Alternatively, the created circuit assembly 134 may be utilized as a "pre-circuit" or "pre-circuit board" assembly and further processed in accordance with the various other process steps illustrated in the following diagrams and included within process 110 and/or with the process steps shown in FIGS. 1(d)–(g) and associated with process 10.

Figure 3D:
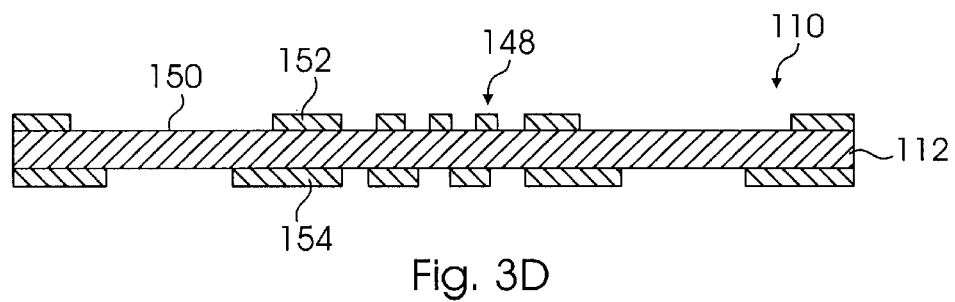

In the fourth step of process 110, as shown best in FIG. 3(d), a pre-circuit assembly 148 is provided. Particularly, pre-circuit assembly 148 includes a core portion 150 operatively contained between "top" electrically conductive members 152 and several "bottom" electrically conductive members 154. In one non-limiting embodiment of the invention, core portion 150 comprises a conventional and commercially available aluminum material. In a further non-limiting embodiment of the invention, electrically conductive members 152, 154 comprise a conventional and commercially available electrically conductive copper material. In a further non-limiting embodiment of the present invention, pre-circuit assembly 148 is selectively immersed in a commercially available etchant material (i.e., a copper etchant) which removes portions of members 152, 154 of pre-circuit assembly 148.

Figure 3E:
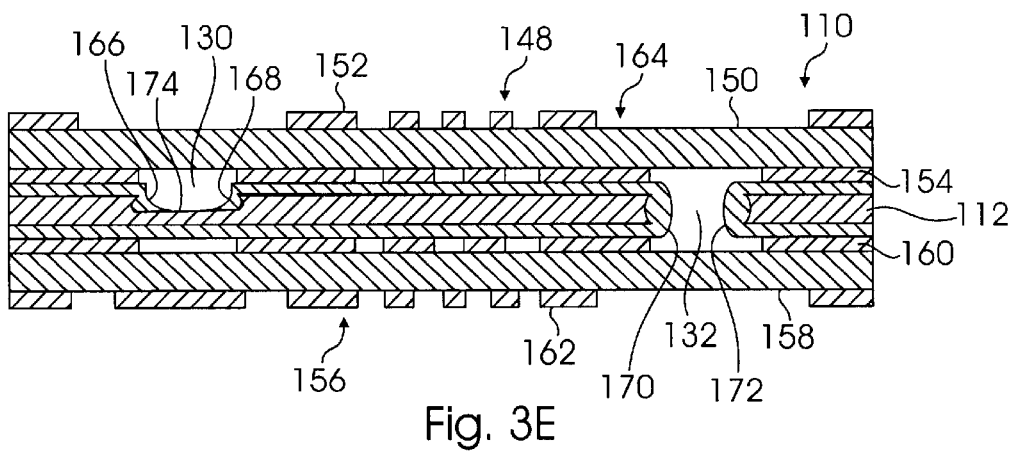

As shown best in FIG. 3(e), process 110 continues by providing a second pre-circuit assembly 156 which, in one non-limiting embodiment of the invention, is substantially similar to pre-circuit assembly 148. Particularly, pre-circuit assembly 156 includes a core member 158 operatively contained between several "top" electrically conductive members 160 and several "bottom" electrically conductive members 162. In one non-limiting embodiment of the invention, core member 158 comprises a conventional and commercially available aluminum material. In a further non-limiting embodiment of the invention, members 160, 162 comprise a conventional and commercially available copper material.

As further shown in FIG. 3(e), pre-circuit assembly 134 is selectively "grown" as additional layers are selectively added to the electronic circuit board assembly or pre-circuit assembly 134. Particularly, process 110 continues by attaching pre-circuit assemblies 148, 156 to pre-circuit assembly 134, thereby forming pre-circuit assembly 164. Members 154 of pre-circuit assembly 148 are attached, connected, and/or otherwise coupled to the "top" surface 136 of pre-circuit assembly 134 and members 160 of re-circuit assembly 156 is attached, connected, and/or otherwise coupled to the "bottom" surface 138 of pre-circuit assembly 134.

In one non-limiting embodiment of the invention, pre-circuit assembly 148 and pre-circuit assembly 156 are attached to pre-circuit assembly 134 by respectively laminating members 154, 160 to surfaces 136, 138. In a further non-limiting embodiment of the present invention, the process of lamination, as set forth above, involves subjecting pre-circuit assemblies 134, 148, 156 to a relatively high temperature and a relatively high pressure, thereby causing portions 142 of dielectric material 118 and portions 146 of dielectric material 120 to selectively "flow" and/or "move" within apertures 130, 132, substantially covering surface 133 of aperture 132 and substantially occupying areas 166, 168 of surface 131 of aperture 130. It should be understood that the presence of dielectric materials 118, 120 upon surface 133 of aperture 132, cause an element, component, or conductor resident within aperture 132 to be "disconnected" from core metal portion 112, thereby forming a "via", which is disconnected from an electrical ground plane in the event that member 112 forms an electrical ground plane and is coupled to a source of electrical ground potential. It should further be appreciated that when portions 142 of material 118 flow into or are placed within aperture 130, a portion 174 of core member 112 remains exposed, thereby causing the electrical ground potential which may be selectively provided by member 112 to be provided within aperture 130 and thereby allowing aperture 130 to be "grounded" or connected to electrical ground plane and further forming a "grounded via".

Figure 3F:
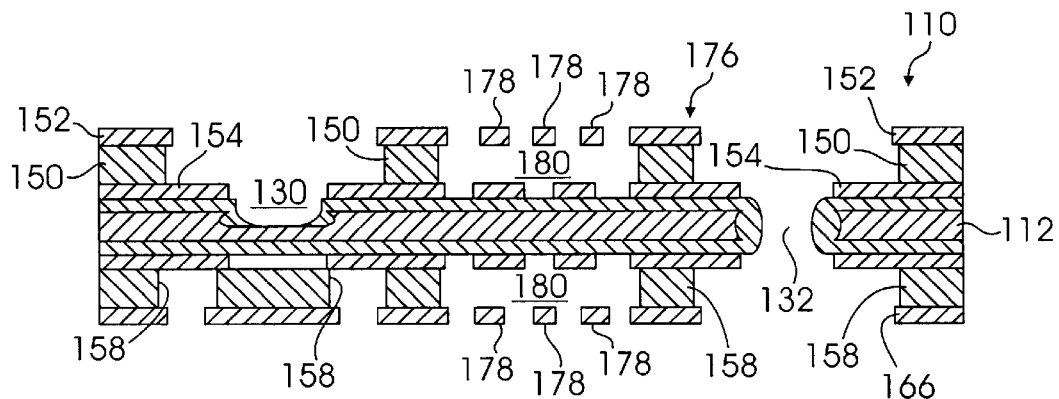

As further shown in FIG. 3(f), process 110 continues by immersing pre-circuit assembly 164 in a conventional and commercially available etchant material (e.g., an aluminum etchant material) which removes portions of core members 150, 158 of each pre-circuit assembly 148, 156, thereby creating pre-circuit assembly 176 having selectively formed air-bridges 178 and selectively formed cavity or apertures 180. In this manner, aperture 132 traverses through the formed assembly 176 and, more particularly, through core members 150 and 158 of pre-circuit assemblies 148, 156, and aperture 130 traverses through pre-circuit assembly 148 and, more particularly, through core member 150 of pre-circuit assembly 148, thereby adding additional layers to the previously formed pre-circuit assembly 134 and lengthening apertures 130, 132. Furthermore in this manner, air-bridges 178 are "suspended" over apertures 180 within pre-circuit assembly 176.

Figure 3G:
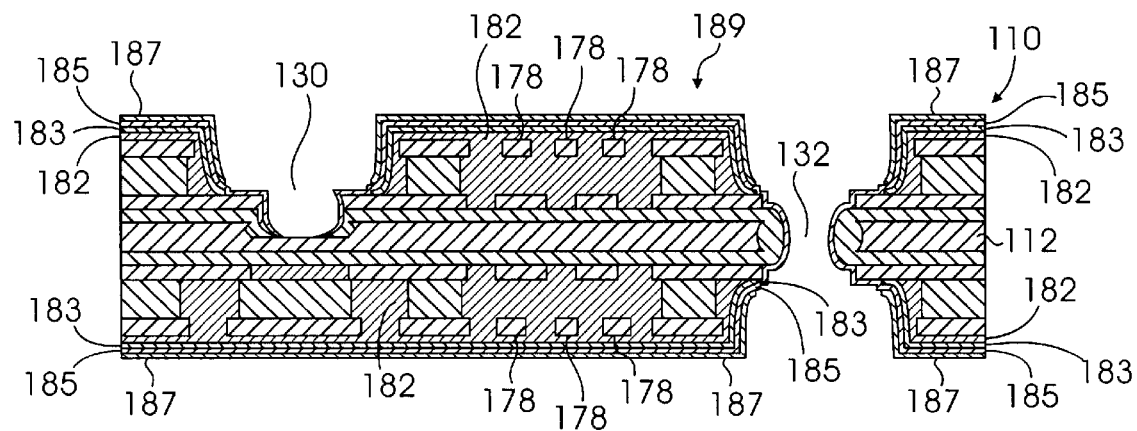

As best shown in FIG. 3(g), process 110 continues by applying a conventional and commercially available "solder mask" material 182 to the formed pre-circuit assembly 176. The "solder mask" material 182 substantially covers the exposed portions of pre-circuit assemblies 148, 156, including portions or members 152, 154, 160, and 162, while concomitantly "underfilling" and/or structurally supporting air-bridges 178. In the preferred embodiment of the invention, material 182 is not placed upon those portions of member 112, and dielectric materials 118, 120 which are exposed within apertures 130, 132.

In one non-limiting embodiment of the invention, this solder mask material 182 is applied to pre-circuit assembly 176 by a conventional "screen printing" process. After the solder mask material 182 is applied to the pre-circuit assembly 176, a first layer of a conventional "plating resistant material" 183 is applied upon the solder mask material 182. A conventional and commercially available "conditioner" is then applied to the dielectric material 118, 120 which was respectively placed within the apertures 130, 132. In one non-limiting embodiment of the invention, it should be understood that the conditioner creates "micro-holes" and/or "micro-apertures" on the surface of portions dielectric material 118, 120 which is resident within apertures 130, 132, effective to allow for relatively better adhesion of a subsequently applied layer of material 185. Particularly, a "seed layer" of an electrically conductive material 185 is selectively applied to pre-circuit assembly 176, substantially covering and/or overlaying material 183 and portions of dielectric material 118, 120 which is resident within apertures 130, 132. In one non-limiting embodiment of the invention, the electrically conductive material 185 which is applied as the "seed layer" comprises a conventional and commercially available copper material. It should be understood that the "seed layer" of electrically conductive material 185 allows for relatively efficient electroplating of the formed apertures 130, 132. A second layer of plating resistant material 187 is selectively applied upon portions of the electrically conductive material 185 which is resident upon the material 183.

Process 110 continues by applying an electrically conductive material 188 the exposed surfaces of material 185 proximate to apertures 130, 132 and upon the exposed portion of member 112 within aperture 130, thereby forming pre-circuit assembly 189. In one non-limiting embodiment of the invention, the electrically conductive material 188 comprises a conventional and commercially available electrically conductive material such as copper. In a further embodiment of the invention, electrically conductive material 188 is applied to pre-circuit assembly to apertures 130, 132 by a conventional electroplating process. In one non-limiting embodiment members 112, 154, 160, electrically conductive material 185, and electrically conductive material 188 each comprise copper which selectively and metallurgically bonds or connects in the aforedescribed electroplating process.

Figure 3H:
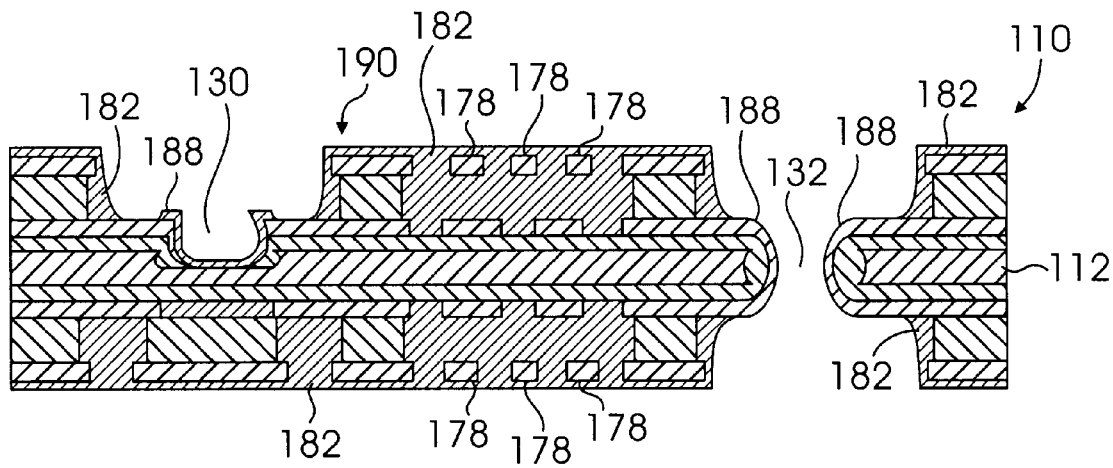

Once the apertures 130, 132 have been electroplated, the layer of material 187 is "stripped" or otherwise removed. Electrically conductive material 185 which resides upon the layer of material 183 is then selectively removed by selectively exposing the electrically conductive material 185 to a conventional etchant material (e.g., a copper etchant). The layer of material 183 is then "stripped" and/or otherwise removed from solder mask material 182, in a known and conventional manner, thereby exposing the solder mask 182 as shown in FIG. 3(h) and forming pre-circuit assembly or circuit board 190 having at least one grounded metal aperture or "via" 130 and one non-grounded aperture or "via" 132 which are formed by a process which obviates the need for drilling. In a further non-limiting embodiment of the invention, a conventional and commercially available surface finish material may be applied to the solder mask material 182.

Figure 4:
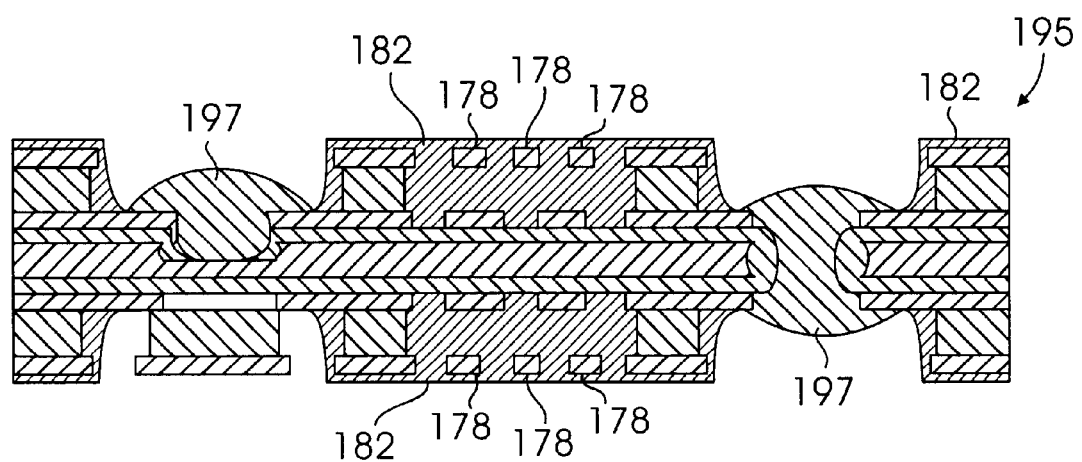
FIG. 4 is a sectional side view of a multi-layer circuit board being produced and/or formed in accordance with the teachings of a fourth embodiment of the invention.

Referring now to FIG. 4, there is shown an alternate embodiment of the invention. Particularly, FIG. 4 illustrates another process 195 by which pre-circuit assembly 190 may be further processed, obviating the need for electroplating. In this non-limiting embodiment of the invention, the "solder mask" material 182 is applied to the pre-circuit assembly 190. In one non-limiting embodiment, a conventional surface finish may then be applied upon the "solder mask" material 182. An electrically conductive material 187 is then selectively placed within apertures 130, 132. In one non-limiting embodiment of the invention, electrically conductive material 197 comprises conventional solder material. In a further non-limiting embodiment of the invention, electrically conductive material 197 comprises a conventional electrically conductive adhesive material.

Referring now to FIGS. 5(a)–(e), there is shown a method and/or a process 200 for selectively forming a multi-layer electronic circuit board, in accordance with the teachings of a fifth embodiment of the invention. Particularly, as is more fully delineated below, process 200 employs an adhesive material which is selectively coupled and/or applied to a core member and which is later subjected to a photo imaging process which causes the adhesive material to be configured and/or formed in a desired pattern, thereby allowing apertures to be selectively formed within the core member without drilling.

As shown, process 200 employs an electrically conductive metal foil and/or core member 202 which may comprise copper or some other conventional and commercially available metal and which is generally rectangular in shape. As shown best in FIG. 5(a), an etchable adhesive material 204 is applied to the top and the bottom surface 206, 208 of the electrically conductive core member 202. In one non-limiting embodiment, the etchable adhesive material 204 substantially covers the top and bottom surfaces 206, 208. Particularly, as should be apparent to those of ordinary skill in the art, material 204 may be "rolled", sprayed, and/or coated upon the surfaces 206, 208 or applied in a "film form" to these core member surfaces 206, 208.

Figure 5A:
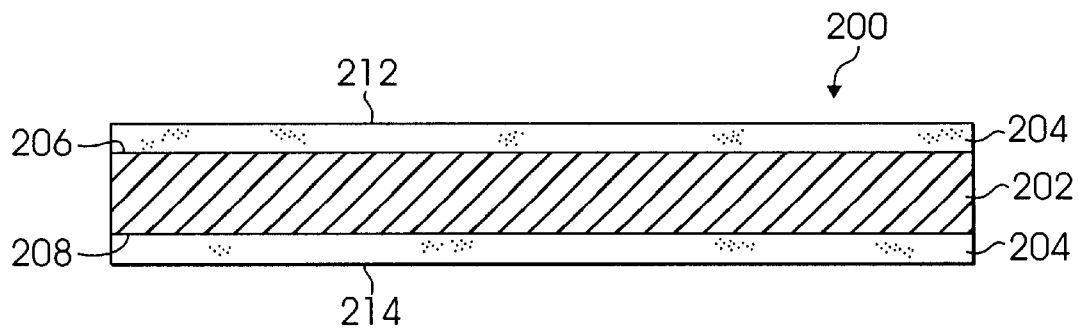
FIGS. 5(a)–(e) are successive sectional side views of a multi-layer circuit board being produced and/or formed in accordance with the teachings of a fifth embodiment of the invention.
Figure 5B:
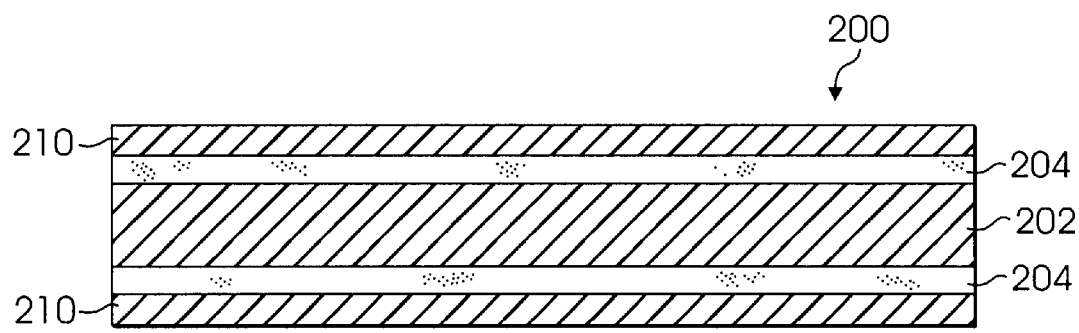

After the adhesive material 204 is applied to member 202 in the foregoing manner, the process 200 continues, as shown best in FIG. 5(b), with the step of applying a conventional and commercially available photo resistive material 210 upon the respective exposed surfaces 212, 214 of the applied adhesive material 204. In one non-limiting embodiment of the invention, the photo resistive material 210 substantially covers the top and bottom surfaces 206, 208.

Figure 5C:
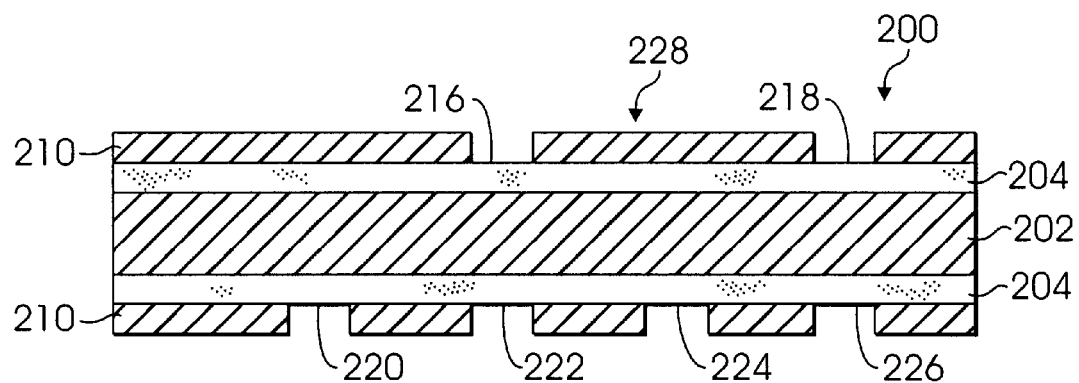

The previously applied photo resistive material 210 is then exposed and developed, in a known and conventional manner, to form exposed adhesive material portions of a selected and unique pattern. This pattern will vary depending upon the type of created circuit which is to be created and/or the type of application that the created circuit is to be used within. In one non-limiting embodiment, by way of example, and as best shown in FIG. 5(c), portions of the material 210 are removed and exposed top surface adhesive material portions 216, 218 and exposed bottom surface adhesive material portions 220, 222, 224, and 226, are concomitantly created, thereby creating a "pre-circuit" board or assembly 228. Portions 216 and 222 are aligned. That is, portion 222 is wholly contained under portion 216 and is substantially the same size and shape as portion 216. Portions 218 and 226 are similarly aligned.

Figure 5D:
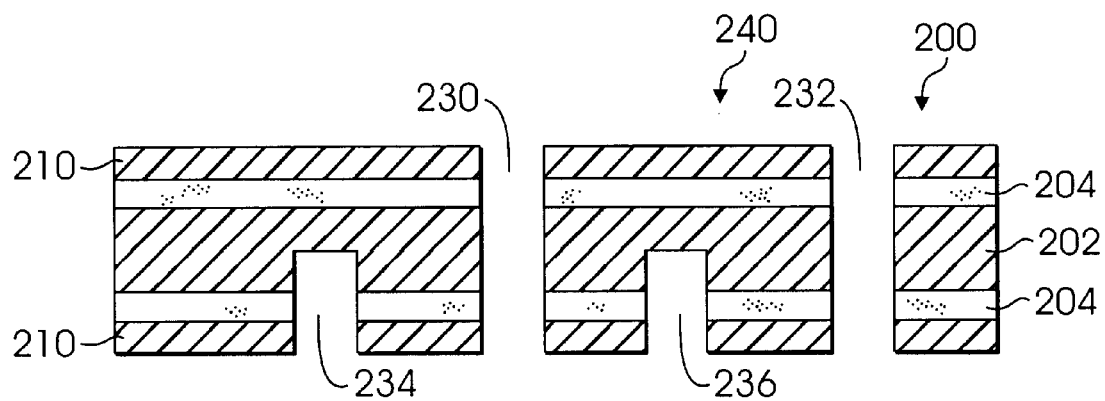

The fourth step of process 200 is shown best in FIG. 5(d) and, in this step, a second pre-circuit assembly 240 is created by subjecting pre-circuit assembly 228 to a commercially available etchant material which creates apertures through the exposed portions of the adhesive material 204. In this non-limiting example, apertures 230 and 232 are created. Particularly, aperture 230 extends through the aligned portions 216 and 222 whiled aperture 232 extends through the aligned portions 218 and 226. Apertures 230, 232 traverse or extend through the core member 202 and the adhesive material 204 respectively residing upon surfaces 206, 208. The etchant material also creates recesses 234, 236 which extend through the adhesive material residing upon surface 208 but which terminate within the core member 202. Particularly, recesses 234, 236 respectively extend through portions 220, 224.

Figure 5E:
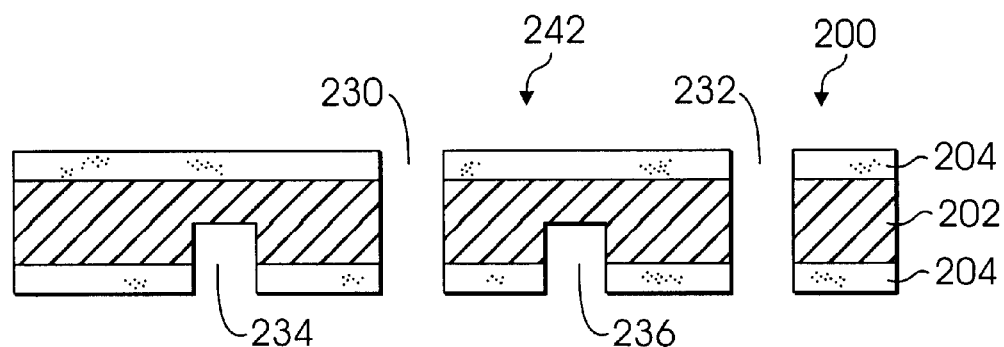

In the fifth step of process 200, which is shown best in FIG. 5(e), the photo resistive material 210 is removed from pre-circuit assembly 240 in a known manner, thereby creating a third pre-circuit assembly 242. Accordingly, pre-circuit assembly 242 may be further processed in accordance with the previously delineated steps of process 10 which are shown, for example and without limitation, in FIGS. 1(b), 1(c), 1(f), and 1(g). Furthermore, pre-circuit assembly 242 may be further processed in accordance with the previously delineated steps of process 110 which are shown, for example and without limitation, in FIGS. 3(b), 3(c), 3(d), 3(e), 3(f), 3(g), and 3(h). In alternate embodiments, pre-circuit assembly 242 may also replace pre-circuit assembly 58 and/or 56 in process 10.

It should be realized that process 200, in this non-limiting embodiment of the invention, allows for the creation of apertures 230, 232 and recesses 234, 236 without the need for drilling or screen printing, thereby providing for an overall relatively efficient and cost-effective circuit assembly process which produces a "pre-circuit board" assembly 242 which allows for the accurate and selective formation of conductive circuits or paths and, more particularly, for the accurate and selective formation of relatively thin conductive circuits or paths, thereby increasing the overall electronic circuit density of the created and/or produced circuit board assembly. Further, process 200 may be employed to create a wide variety of circuit boards and/or assemblies and that, in other circuit applications, adhesive material 204 and photo resistive material 210 may only be applied to one or a portion of one of the surfaces 206, 208, thereby allowing for the selective creation of a wide variety of circuit assemblies and configurations and allowing for the selective creation of several such "grounded" and "non-grounded" apertures.

Referring now to FIGS. 6(a)–(e) there is shown a circuit board and/or circuit board assembly creation process 250 which is made and/or undertaken in accordance with the teachings of a sixth embodiment of the invention. Particularly, as is more fully delineated below, process 250 requires the acquisition and/or creation of a core or foil member 252 which is electrically conductive. In one non-limiting embodiment of the invention, core member 252 comprises copper or some other commercially available metal. Particularly, as is more fully delineated below, the core member 252 initially and selectively receives photo resistive material and is then subjected to a photo imaging process. The core member 252 is then made to selectively receive adhesive material which does not substantially "wet" or bond with the previously applied photo resistive material, thereby allowing the photoresistive material to be removed to create a pattern of exposed core member regions. Holes or apertures are then selectively formed within the core member 252 by use of the exposed regions or portions of the core member 252 in accordance with a certain desired circuit board/assembly configuration or a circuit board application requirement.

Figure 6A:
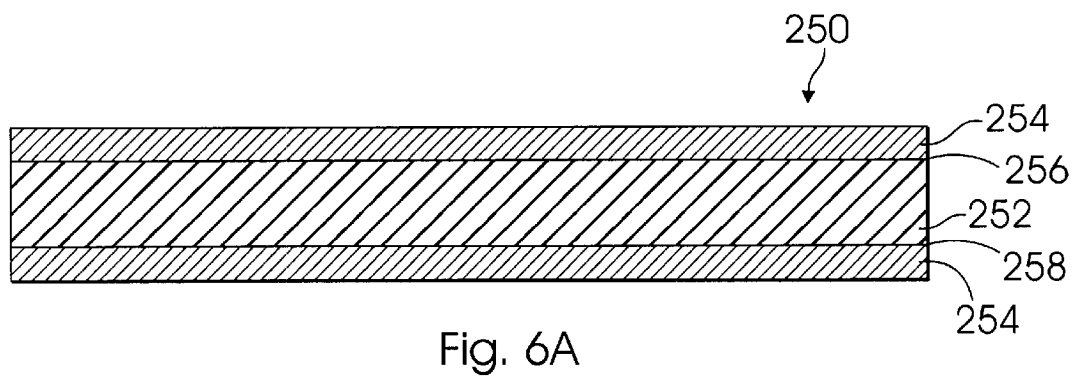
FIGS. 6(a)–(e) are successive sectional side views of a multi-layer circuit board being produced and/or formed in accordance with the teachings of a sixth embodiment of the invention.

As shown best in FIG. 6(a), the first step of process 250 begins with the acquisition, creation, and/or use of a core and/or foil member 252 which, in one non-limiting embodiment of the invention, is substantially identical to member 202. As further shown in FIG. 6(a), a commercially available photo resistive material 254 is initially applied to the top and bottom surfaces 256, 258 of the core and/or foil member 252. In one non-limiting embodiment of the invention, material 254 is substantially identical to material 210 of process 200.

Figure 6B:
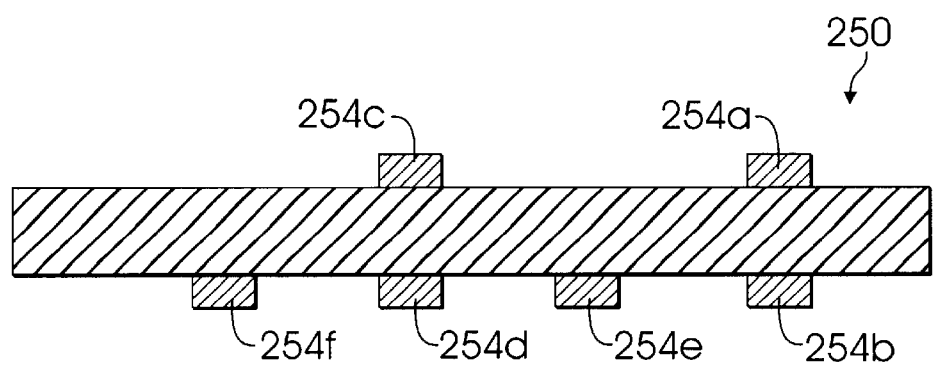

In the second step of process 250, which is best shown in FIG. 6(b), the applied photo resistive material 254 is selectively exposed, developed, and etched in a known manner, effective to remove most of the applied material 254 from the core member 252, and to allow the remaining material 254 to overlay only certain portions of surfaces 256, 258 and in a particular and desired pattern. One non-limiting example of one such pattern is shown in FIG. 6(b). This non-limiting pattern is presented in order to exemplify certain features of this process 250 and should not limit the generality of this invention. Specifically, portions of material 254(a) and 254(b); and portions 254(c) and 254(d) are aligned. That is, portion 254(a) is substantially similar in size and shape to portion 254(b) and portion 254(b) wholly resides under portion 254(a) but upon an opposite surface of member 252 to the surface which portion 254(a) resides. Similarly, portion 254(c) is substantially similar in size and shape to portion 254(d) and portion 254(d) wholly resides under portion 254(c) but upon an opposite surface of member 252 to that which portion 254(c) resides. Aligned portions 254(a), 254(b) and 254(c), 254(d) cooperatively and respectively allow for the formation of "vias" or "through holes" in the created circuit assembly while those "non-aligned" portions of material 254 (e.g., portions 254(e) and 254(f)) only allow for the formation of recesses within the created circuit assembly, as shown below.

Figure 6C:
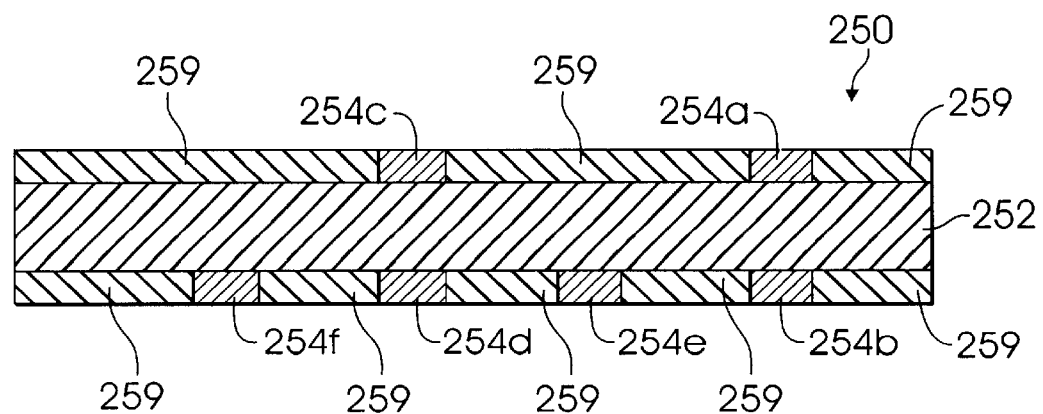

In the third step of process 250 which is best shown in FIG. 6(c), a substantially "non-wetting" or "dry" type of adhesive material 259 is applied to the exposed surfaces 256, 258(i.e., to those surfaces which do not have and/or contain material 254). Material 259 does not substantially "wet" or bond with material 254 (e.g., the remaining portions 254(a)–(f)), and thus, material 254, (e.g., portions 254(a)–(f)) is relatively easily removed in the fourth step of process 250, and leaves relatively "clean" and relatively "sharp" edges. In addition, the material 259 substantially retains its desirable dielectric attributes and/or properties as the process 250 continues in a manner which is delineated below.

Figure 6D:
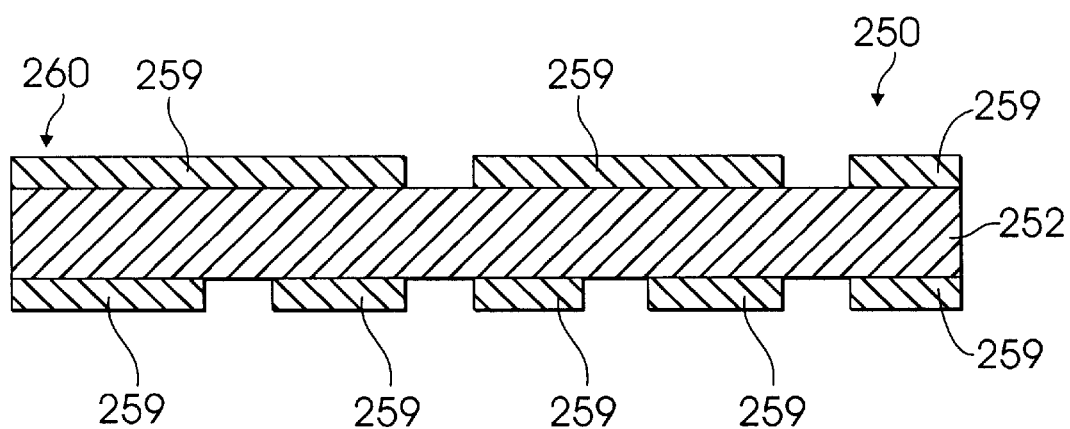
Figure 6E:
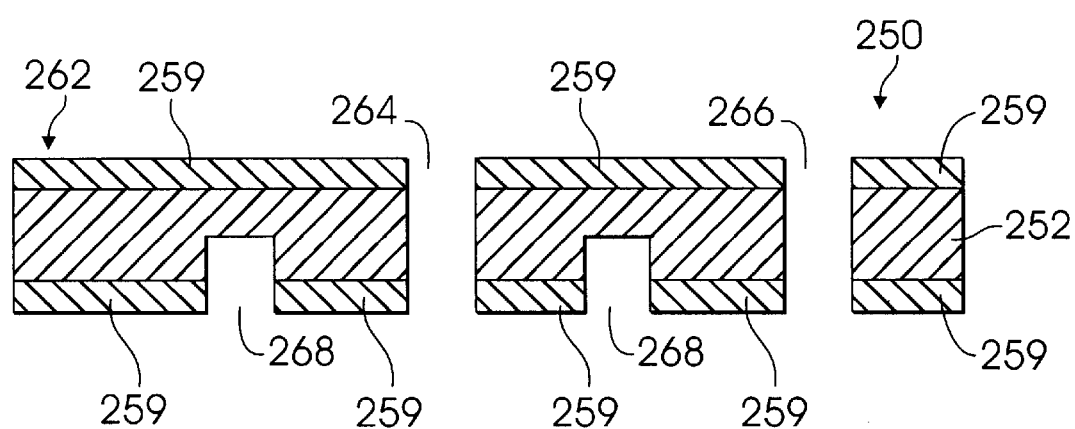

In the fourth step of process 250, as best shown in FIG. 6(d), the photo resistive material 254 (e.g., the remaining portions 254(a)–254(f)) is (are) "stripped away" by a known method, thereby creating a "pre-circuit assembly" 260. In the fifth step of process 250, the pre-circuit assembly 260 is etched, thereby creating a "pre-circuit" assembly 262 having apertures 264, 266 respectively extending through the assembly 262 and, more particularly, through those respective portions of the "pre-circuit" assembly 262 previously occupied by aligned portions 254(c), 254(d); and 254(a), 254(b).

In one non-limiting embodiment of the invention, apertures 264, 266 are respectively and substantially similar to apertures 230, 232 of "pre-circuit" assembly or board 242. Pre-circuit assembly 262 further includes recesses 268, 270 which respectively occupy the space or position previously occupied by material portions 254(f) and 254(e), and which terminate within the core member 252 (e.g., extending into member 252 a distance equal to about one half of the width of the core member 252).

It should be appreciated that process 250 allows for the selective creation of a "pre-circuit" assembly 262 having apertures 264, 266 which are formed without the use of screen printing or drilling. Moreover, these apertures 264, 266, by the use of formed recesses 268, 270, may be electrically grounded (e.g., portions of the member 252 residing within the aperture 266 may be communicatively coupled to a source of electrical ground potential through recesses 264, 260) or non-grounded (e.g., portions of member 252 residing within the aperture 264 may be isolated from the source of electrical ground potential applied to certain other portions of member 252 through recesses 268, 270). It should be further appreciated that pre-circuit board or assembly 252 may be further subjected to the process steps shown in FIGS. 1(b), 1(c), 1(d), 1(e), 1(f), 1(g), 1(h) and contained within process 10. It should further be appreciated that pre-circuit 262 may be further subjected to the process steps shown in FIGS. 3(b), 3(c), 3(d), 3(e), 3(f), 3(g) and contained within process 110. Further, pre-circuit assembly 262 may replace or may be used in place of the pre-circuit assemblies 58 or 56 in process 10.

Figure 7A:
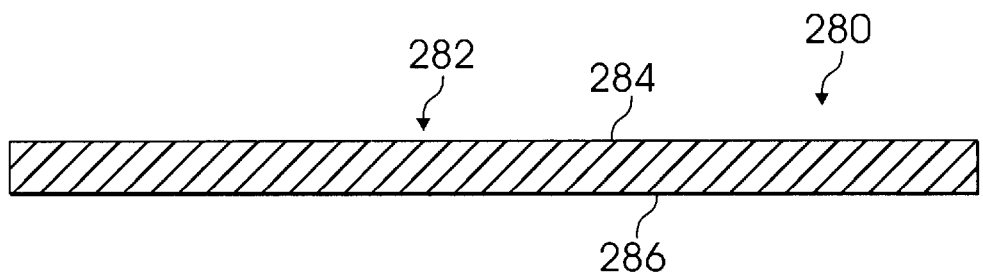
FIGS. 7(a)–(c) are successive sectional side views of a multi-layer circuit board being produced and/or formed in accordance with the teachings of a seventh embodiment of the invention.
Figure 7B:
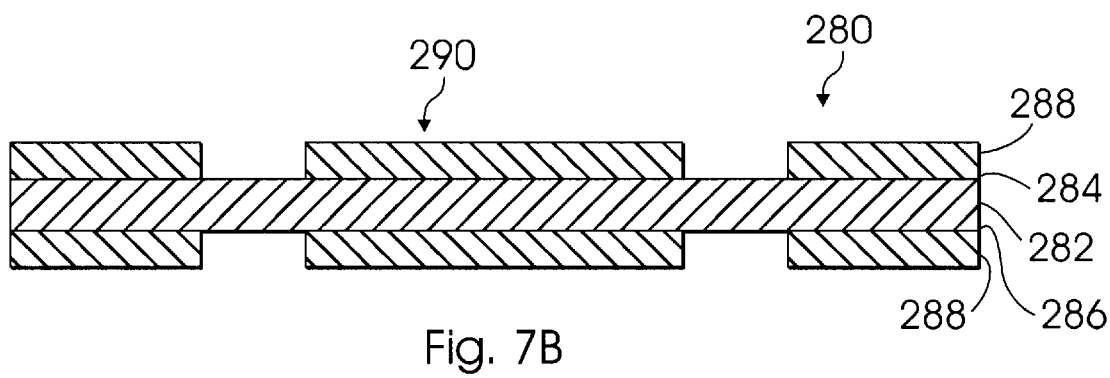
Figure 7C:
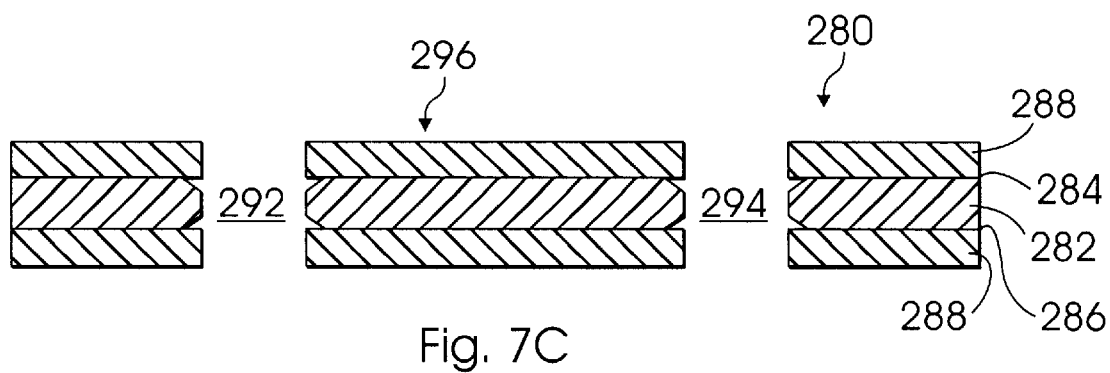

Referring now to FIGS. 7(a)–(c), there is shown a method and/or a process 280 for selectively forming a multi-layer electronic circuit board in accordance with the teachings of an alternate embodiment of the present invention.

Specifically, as shown best in FIG. 7(a), the circuit board formation or creation process 280 begins with the acquisition of a core portion or member 282 having a top surface 284 and a bottom surface 286. In one non-limiting embodiment of the invention, member 282 comprises a conventional and commercially available electrically conductive material such as copper. In a further non-limiting embodiment of the invention, member or core portion 282 comprises a conventional and commercially available metal such as aluminum. In one non-limiting embodiment of the invention, member or core portion 282 is substantially similar to member 12, as shown in FIG. 1(d).

In the second step of process 280, as shown best in FIG. 7(b), a certain commercially available "photo imageable" layer of dielectric etch resistant material 288 is selectively applied to both the top surface 284 and the bottom surface 286 of core metal portion 282, thereby forming a pre-circuit assembly 290.

In the third step of process 280, as shown best in FIG. 7(c), the pre-circuit assembly 290 is selectively immersed in a conventional and commercially available etchant material, effective to create apertures and/or perforations 292, 294 within core metal portion 282, thereby forming pre-circuit assembly 296.

It should be appreciated that the pre-circuit assembly 296, as created by process 280, may be formed in a variety of shapes and sizes. It should further be appreciated that process 280 allows for the selective creation of a pre-circuit assembly 296 having apertures 292, 294 which are formed without the use of drilling. It should be further appreciated that pre-circuit assembly 296 may be further subjected to the process steps shown in FIGS. 1(b), 1(c), 1(d), 1(e), 1(f), and 1(g) and contained within process 10. It should further be appreciated that pre-circuit assembly 296 may be further subjected to the process steps shown in FIGS. 3(b), 3(c), 3(d), 3(e), 3(f), 3(g), and 3(h) and contained within process 110. Pre-circuit assembly 296 may also replace pre-circuit assemblies 58 or 56 in process 10.

Referring now to FIGS. 8(a)–(e), there is shown a method and/or process 310 for selectively forming a multi-layer electronic circuit board in accordance with the teachings of yet an alternate embodiment of the invention. Specifically, as shown best in FIG. 8(a), the circuit board formation or process 310 begins with the formation and/or acquisition of an electrically conductive member or core member 312, such as and without limitation a "metal foil" member, having a top surface 314 and a bottom surface 316. In one non-limiting embodiment of the invention, member 312 is generally rectangular in shape, however other shapes may be utilized. In this non-limiting embodiment, metal foil 312 comprises a copper strip or foil.

Figure 8A:
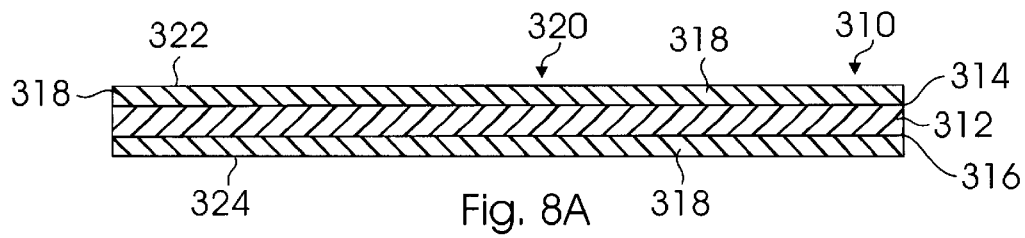
FIGS. 8(a)–(e) are successive sectional side views of a multi-layer circuit board being produced and/or formed in accordance with the teachings of an eighth embodiment of the invention.

As further shown in FIG. 8(a), a certain conventional and commercially available dielectric adhesive material 318 is applied upon the top surface 314 and the bottom surface 316 of metal foil member 312, thereby forming pre-circuit assembly 320, having a top surface 322 and a bottom surface 324.

Figure 8B:
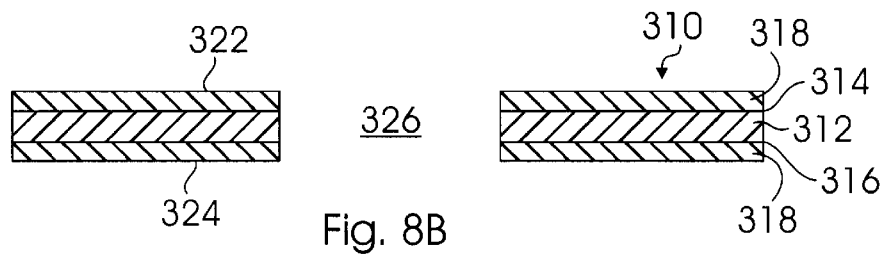

In the second step of process 310, as shown best in FIG. 8(b), an aperture 326 is selectively formed within pre-circuit assembly 320, thereby forming a pre-circuit assembly 321. In one non-limiting embodiment, the aperture 326 is formed by drilling pre-circuit assembly 320. However, in other non-limiting embodiments of the invention, aperture 326 may be formed by other known and conventional methods, such as by punching or etching.

Figure 8C:
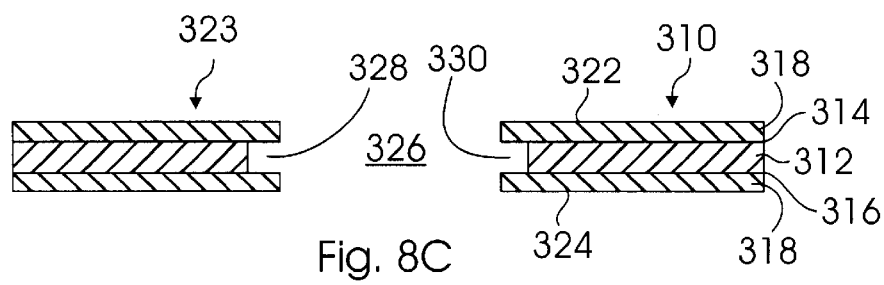

In the third step of process 310, as shown best in FIG. 8(c), a conventional and commercially available etchant material is applied to pre-circuit assembly 310, effective to remove certain portions of member 312 which are exposed and/or reside within aperture 326, thereby forming recesses 328, 330, which cooperatively allow for certain portions of material 322, 324 to "overhang" or partially extend over member 312 and creating pre-circuit assembly 323.

Figure 8D:
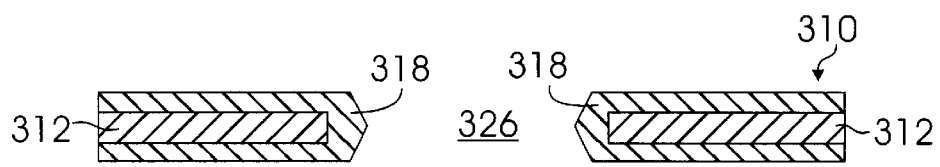

In the fourth step of process 310, as shown best in FIG. 8(d), material 322, 324 which overhangs aperture 326 is respectively caused to flow into the aperture 326 which is effective to substantially cover the portion of member 312 which resides within the aperture 326, thereby forming a "non-grounded" aperture 326 (e.g., assuming member 312 is coupled to a source of electrical ground potential and forms an electrical ground plane) and forming pre-circuit assembly 327. In this manner, a component, element, or conductor which is placed in the aperture 326 is electrically isolated from member 312,.

Figure 8E:
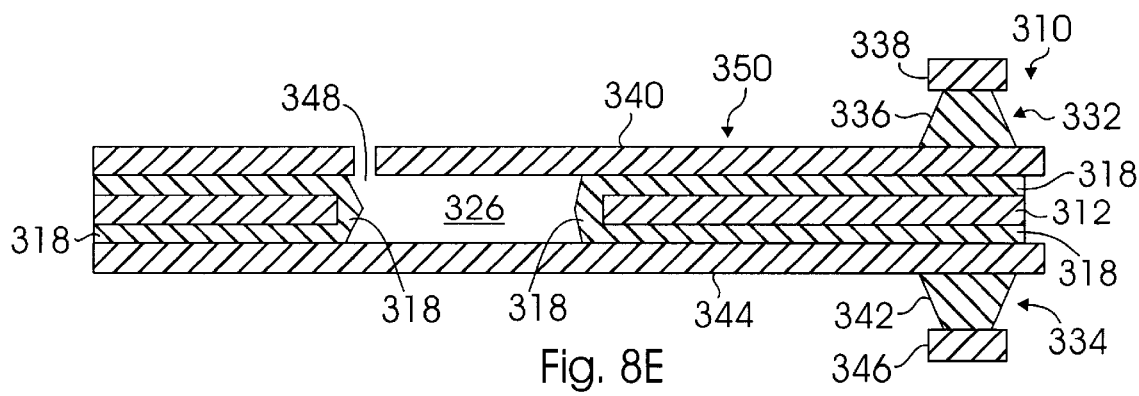

In the fifth step of process 310, as shown best in FIG. 8(e), pre-circuit assemblies 332, 334 are provided. Pre-circuit assembly 332 includes a core member 336 operatively contained between a top electrically conductive member 338 and a bottom electrically conductive member 340. Pre-circuit assembly 334 includes a core member 342 operatively contained between a top electrically conductive member 344 and a bottom electrically conductive member 346. Pre-circuit assembly 332 is selectively attached to pre-circuit assembly 320 by affixing, connecting, and/or coupling electrically conductive member 340 to the surface 322 of the dielectric material 318 of pre-circuit assembly 327, in a manner which is effective to allow aperture 348 within member 340 to communicate with aperture 326 while concomitantly allowing a selective portion of member 340 to overlay the formed aperture 326. Pre-circuit assembly 334 is attached to pre-circuit assembly 327 by affixing, connecting, and/or coupling electrically conductive member 344 to the surface 324 of the dielectric material 318, effective to allow member 344 to overlay the formed aperture 326, thereby forming pre-circuit assembly 350.

Accordingly, pre-circuit assembly 350 may be further processed in accordance with the previously delineated steps of process 10 which are shown, for example and without limitation, in FIGS. 1(b), 1(c), 1(d), 1(e), 1(f), and 1(g). Furthermore, pre-circuit assembly 350 may be further processed in accordance with the previously delineated steps of process 110 which are shown, for example and without limitation, in FIGS. 3(b), 3(c), 3(d), 3(e), 3(f), 3(g), and 3(h). Pre-circuit assembly 350 may replace or may be used in place of the pre-circuit assemblies 58 or 56 in process 10.

Referring now to FIGS. 9(a)–(e), there is shown a method and/or process 360 for selectively forming a multi-layer electronic circuit board in accordance with the teachings of an alternate embodiment of the invention. Specifically, as shown best in FIG. 9(a), the circuit board formation or process 360 begins with the acquisition and/or formation of an electrically conductive member or core member 362. Core member 362 preferably comprises without limitation a "metal foil" member, having a top surface 364 and a bottom surface 366. In one non-limiting embodiment of the invention, member 362 is generally rectangular in shape, however other shapes may be utilized. In this non-limiting embodiment, metal foil 362 comprises a copper strip or foil member.

Figure 9A:
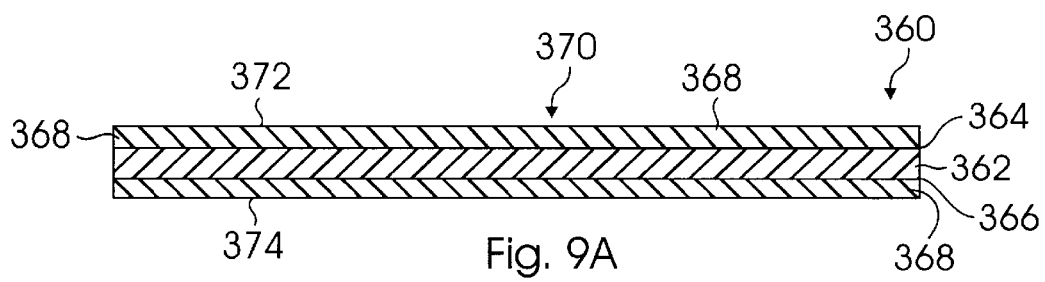
FIGS. 9(a)–(e) are successive sectional side views of a multi-layer circuit board being produced and/or formed in accordance with the teachings of a ninth embodiment of the invention.

As further shown in FIG. 9(a), a certain conventional and commercially available dielectric adhesive material 368 is applied upon the top surface 364 and the bottom surface 366 of metal foil member 362, thereby forming pre-circuit assembly 370, having a top surface 372 and a bottom surface 374.

Figure 9B:
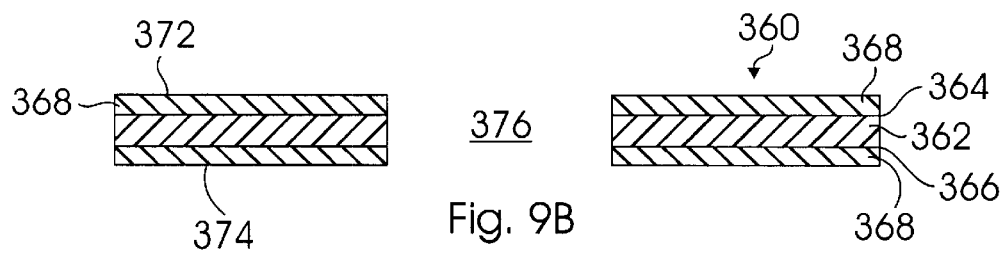

In the second step of process 360, as shown best in FIG. 9(b), an aperture 376 is formed within pre-circuit assembly 370, thereby forming a pre-circuit assembly 371. In one non-limiting embodiment, the aperture 376 is formed by drilling pre-circuit assembly 370. However, in other non-limiting embodiments of the invention, aperture 376 may be formed by other known and conventional methods.

Figure 9C:
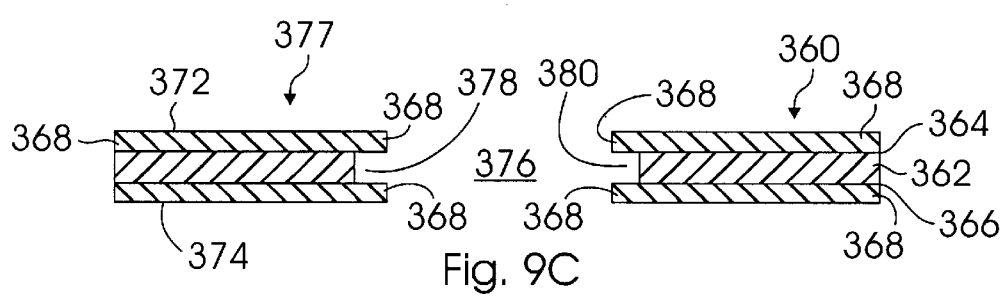

In the third step of process 360, as shown best in FIG. 9(c), a conventional and commercially available etchant material is applied to pre-circuit assembly 370 and is effective to remove certain portions of member 362 which are exposed and/or resident within the formed aperture 376, thereby forming recesses 378, 380, which cooperatively allow for certain portions of material 368 to "overhang" or extend over members 362 and forming a pre-circuit assembly 377.

Figure 9D:
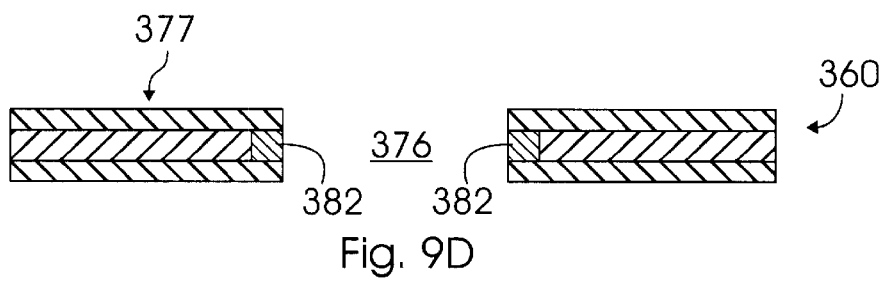

In the fourth step of process 360, as shown best in FIG. 9(d), a certain conventional and commercially available "solder mask" material 382 is selectively applied to pre-circuit assembly 377 and is effective to substantially cover the portion of member 362 resident within aperture 376 and to cause a conductor, component, or element resident within aperture 376 to be electrically isolated and/or disconnected from core metal member 362, thereby forming a "non-grounded via" in the event that member 362 is coupled to a source of electrical ground potential or an electrical ground plane.

Figure 9E:
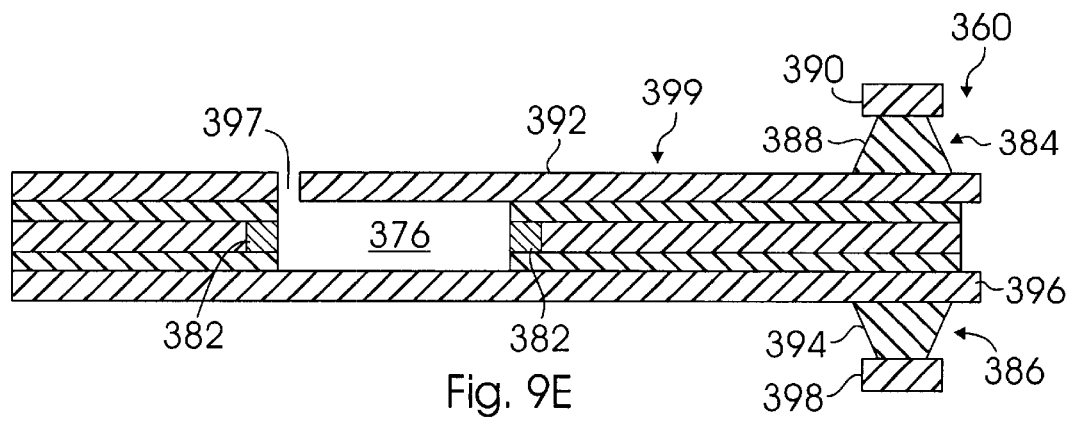

In the fifth step of process 360, as shown best in FIG. 9(e), pre-circuit assemblies 384, 386 are provided. Pre-circuit assembly 384 includes a core member 388 operatively contained between a top electrically conductive member 390 and a bottom electrically conductive member 392. Pre-circuit assembly 386 includes a core member 394 operatively contained between a top electrically conductive member 396 and a bottom electrically conductive member 398. Pre-circuit assembly 384 is selectively attached to pre-circuit assembly 379 by affixing, connecting, and/or coupling electrically conductive member 392 to the surface 372 of the dielectric material 368, effective to allow aperture 397 within member 392 to communicate with aperture 376 while allowing a portion of member 392 to overlay aperture 376. Pre-circuit assembly 386 is attached to pre-circuit assembly 370 by affixing, connecting, and/or coupling electrically conductive member 396 to dielectric material 368 residing upon surface 374 of pre-circuit assembly 370, effective to allow member 396 to overlay the formed aperture 376, thereby forming pre-circuit assembly 399.

Pre-circuit assembly 399 may be further processed in accordance with the previously delineated steps of process 10 which are shown, for example and without limitation, in FIGS. 1(b), 1(c), 1(d), 1(e), 1(f), and 1(g). Furthermore, pre-circuit assembly 399 may be further processed in accordance with the previously delineated steps of process 110 which are shown, for example and without limitation, in FIGS. 3(b), 3(c), 3(d), 3(e), 3(f), 3(g), and 3(h). Pre-circuit assembly 402 may also replace or may be used in place of the pre-circuit assemblies 58 or 56 in process 10.

It should be understood that the invention is not limited to the exact embodiment or construction which has been illustrated and described but that various changes may be made without departing from the spirit and the scope of the invention.

What is claimed is:

1. A method for making a circuit board comprising the steps of:

providing a first member having a first surface and a second surface;

applying an etch resistant material to certain portions of said first and second surfaces, thereby exposing at least a first and a second portion of said first surface and at least a first and a second portion of said second surface, said first portion of said first surface being aligned with the first portion of said second surface and said second portion of said first surface being offset from said second portion of said second surface;

creating a first aperture within said first member, said first aperture extending through said first portion of said first surface and said first portion of said second surface and having an interior surface which is substantially covered by said etch resistant material;

selectively removing said second portion of said first surface and said second portion of said second surface, effective to create a second aperture within said first member and to cause said etch resistant material to flow within said second aperture;

providing a first pre-circuit assembly;

attaching said first pre-circuit assembly to a portion of said etch resistant material, effective to cause said first pre-circuit assembly to overlay said first and second apertures;

selectively removing portions of said first pre-circuit assembly, thereby creating at least one air-bridge and lengthening said first and second apertures; and plating said first and second apertures, thereby creating a multi-layer circuit board.

2. The method of claim 1 wherein said first pre-circuit assembly is formed by a process comprising the steps of:

providing an electrically conductive member;

placing an etchable adhesive material upon said electrically conductive member;

selectively removing portions of said etchable adhesive material thereby forming certain exposed portions of said electrically conductive member; and etching said electrically conductive member, effective to form a first aperture through a first and a second of said exposed portions and a second aperture through a third and a fourth of said exposed portions, thereby forming said first pre-circuit assembly.

3. The method of claim 1 wherein said first pre-circuit assembly is formed by a process comprising the steps of:

providing an electrically conductive member;

placing photo resistive material upon first portions of said electrically conductive member;

placing a dry adhesive material upon second portions of said electrically conductive member;

removing said photo resistive material from said electrically conductive member; and creating at least one aperture within said electrically conductive member through said first portions, thereby forming said pre-circuit assembly.

4. The method of claim 1 wherein said first pre-circuit assembly is formed by a process comprising the steps of:

providing an electrically conductive member;

placing a photo-imageable layer of dielectric etch resistant material upon portions of said electrically conductive member; and etching said electrically conductive member, effective to form at least one aperture, thereby creating said first pre-circuit assembly.

5. The method of claim 1 wherein said first pre-circuit assembly is formed by a process comprising the steps of:

providing an electrically conductive member;

placing dielectric adhesive material upon said member;

forming an aperture within said electrically conductive member, effective to allow said dielectric adhesive material to partially extend over said aperture; and coupling a second electrically conductive member to said dielectric adhesive material.

6. The method of claim 1 wherein said second aperture has a second ridged interior surface.

7. A method of making a multi-layer circuit board comprising the steps of:

providing an electric ground plane core member having a top surface and a bottom surface;

applying an etch resistant material to portions of said core member, whereby said top surface has a first exposed portion which is substantially aligned with a first exposed portion of said bottom surface and said top surface has a second exposed portion which is offset from a second exposed portion of said bottom surface;

forming a first aperture within said core member through said aligned first exposed portions of said top surface and said bottom surface, said first aperture having an interior surface covered by said etch resistant material;

forming a second aperture within said core member by removing said second portion of said top surface and said second portion of said bottom surface, wherein said removal causes said etch resistant material to flow within said second aperture;

providing a first pre-circuit assembly;

coupling said first pre-circuit assembly to a portion of said etch resistant material on said top surface of said core member wherein said first pre-circuit assembly overlays said first and second apertures;

forming at least one air-bridge by removing portions of said first pre-circuit assembly;

providing a second pre-circuit assembly;

coupling said second pre-circuit assembly to a portion of said etch resistant material on said bottom surface of said core member wherein said second pre-circuit assembly overlays said first and second apertures; and plating said first and second apertures.

8. The method of claim 7 further comprising the step of:

forming at least one air-bridge by removing portions of said second pre-circuit assembly.

9. The method of claim 7 wherein said first and second pre-circuit assembles are formed by a process comprising the steps of:

providing an electrically conductive member;

placing an etchable adhesive material upon said electrically conductive member;

selectively removing portions of said etchable adhesive material thereby forming certain exposed portions of said electrically conductive member; and etching said electrically conductive member, effective to form a first aperture through a first and a second of said exposed portions and a second aperture through a third and a fourth of said exposed portions, thereby forming said pre-circuit assemblies.

10. The method of claim 7 wherein said first and second pre-circuit assemblies are formed by a process comprising the steps of:

providing an electrically conductive member;

placing photo resistive material upon first portions of said electrically conductive member;

placing a dry adhesive material upon second portions of said electrically conductive member;

removing said photo resistive material from said electrically conductive member; and creating at least one aperture within said electrically conductive member through said first portions, thereby forming said first and second pre-circuit assemblies.

11. The method of claim 7 wherein said first and second pre-circuit assemblies are formed by a process comprising the steps of:

providing an electrically conductive member;

placing a photo-imageable layer of dielectric etch resistant material upon portions of said electrically conductive member; and etching said electrically conductive member, effective to form at least one aperture.

12. The method of claim 7 wherein said first and second pre-circuit assemblies are formed by a process comprising the steps of:

providing an electrically conductive member;

placing dielectric adhesive material upon said member;

forming an aperture within said electrically conductive member, effective to allow said dielectric adhesive material to partially extend over said aperture; and coupling a second electrically conductive member to said dielectric adhesive material.

13. The method of claim 7 wherein said second aperture has a second ridged interior surface.

* * * * *